United States Patent
Koudele et al.

(10) Patent No.: US 10,852,953 B2
(45) Date of Patent: Dec. 1, 2020

(54) DYNAMIC TEMPERATURE COMPENSATION IN A MEMORY COMPONENT

(71) Applicant: Micron Technology, Inc., Boise, ID (US)

(72) Inventors: Larry J. Koudele, Erie, CO (US); Bruce A. Liikanen, Berthoud, CO (US); Steve Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 16/170,423

(22) Filed: Oct. 25, 2018

(65) Prior Publication Data
US 2020/0133510 A1   Apr. 30, 2020

(51) Int. Cl.
G06F 3/06       (2006.01)
G11C 7/04       (2006.01)
G11C 29/02      (2006.01)
G11C 16/34      (2006.01)

(52) U.S. Cl.
CPC .......... *G06F 3/0614* (2013.01); *G06F 3/0653* (2013.01); *G06F 3/0673* (2013.01); *G11C 7/04* (2013.01); *G11C 16/3459* (2013.01); *G11C 29/028* (2013.01)

(58) Field of Classification Search
CPC ..... G11C 7/04; G11C 16/3459; G11C 29/028; H01L 23/34; G06F 3/0653; G06F 3/0614; G06F 3/0673
See application file for complete search history.

(56) References Cited

U.S. PATENT DOCUMENTS

| | | | |
|---|---|---|---|
| 9,384,846 B1 * | 7/2016 | Shim | G11C 7/04 |
| 2003/0227792 A1 * | 12/2003 | Marr | G11C 11/39 |
| | | | 365/154 |
| 2010/0008151 A1 | 1/2010 | Hwang | |
| 2018/0061504 A1 | 3/2018 | Kim et al. | |

FOREIGN PATENT DOCUMENTS

JP     2013080540 A     5/2013

OTHER PUBLICATIONS

International Application No. PCT/US2019/053254—International Search Report and Written Opinion, dated Jan. 15, 2020, 10 pages.

* cited by examiner

*Primary Examiner* — Ernest Unelus
(74) *Attorney, Agent, or Firm* — Perkins Coie LLP

(57) ABSTRACT

A dynamic temperature compensation trim for use in temperature compensating a memory operation on a memory call of a memory component. The dynamic temperature compensation trim is based on a temperature of the memory component and based on in-service data for the memory operation on the memory cell. A register for the memory operation is modified based on the dynamic temperature compensation trim.

20 Claims, 7 Drawing Sheets

300

DETERMINE A DYNAMIC TEMPERATURE COMPENSATION TRIM FOR USE IN TEMPERATURE COMPENSATING A MEMORY OPERATION ON A MEMORY CELL OF A MEMORY COMPONENT BASED ON A TEMPERATURE OF THE MEMORY COMPONENT AND BASED ON IN-SERVICE DATA FOR THE MEMORY OPERATION ON THE MEMORY CELL
310

MODIFY A REGISTER CORRESPONDING TO THE MEMORY OPERATION ON THE MEMORY CELL BASED ON THE DYNAMIC TEMPERATURE COMPENSATION TRIM
320

300

DETERMINE A DYNAMIC TEMPERATURE COMPENSATION TRIM FOR USE IN TEMPERATURE COMPENSATING A MEMORY OPERATION ON A MEMORY CELL OF A MEMORY COMPONENT BASED ON A TEMPERATURE OF THE MEMORY COMPONENT AND BASED ON IN-SERVICE DATA FOR THE MEMORY OPERATION ON THE MEMORY CELL
310

MODIFY A REGISTER CORRESPONDING TO THE MEMORY OPERATION ON THE MEMORY CELL BASED ON THE DYNAMIC TEMPERATURE COMPENSATION TRIM
320

PV Level Register For Memory Component 112A (568)

| Memory Location | Base Value | ReadCal Trim | Manuf. Temp. Trim | Dynamic Temp. Trim |
|---|---|---|---|---|
| (LVL_2, WLG_4) 0.93 v | 0.9 v | 0.02 v | −0.02 v | 0.03 v |
| (LVL_3, WLG_4) 1.32 v | 1.3 v | 0.03 v | −0.02 v | 0.01 v |
| (LVL_4, WLG_4) 1.11 v | 1.1 v | 0.01 v | 0.01 v | −0.01 v |
| ⋯ | ⋯ | ⋯ | ⋯ | ⋯ |
| (LVL_7, WLG_7) 0.96 v | 0.9 v | 0.04 v | 0.01 v | 0.01 v |

510 — Base Value
512 — ReadCal Trim
514 — Manuf. Temp. Trim
516 — Dynamic Temp. Trim
502, 530

Curve Fit Coeff Register For Memory Component 112A

| Memory Locations | Read Slope | Read Offset | ... | PV Slope | PV Offset |
|---|---|---|---|---|---|
| LVL_2, WLG_4 | 0.067 | 2.2 | | 0.067 | 1.8 |
| LVL_3, WLG_4 | 0.065 | 2.1 | | 0.065 | 1.5 |
| LVL_4, WLG_4 | 0.067 | 1.8 | | 0.067 | 1.9 |
| ... | | | | | |
| LVL_7, WLG_7 | 0.068 | 2.2 | | 0.068 | 1.8 |

FIG. 6

DYNAMIC TEMPERATURE COMPENSATION IN A MEMORY COMPONENT

TECHNICAL FIELD

Embodiments of the disclosure generally relate to memory sub-systems, and more specifically, relate to dynamic temperature compensation in a memory component of a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3 is a flow diagram of an example method to provide a dynamic temperature compensation trim for memory operations in accordance with some embodiments of the present disclosure.

FIG. 5 illustrates a block diagram of a program verify level register, in accordance with some embodiments of the present disclosure.

FIG. 6 illustrates a block diagram of a curve fit coefficients register, in accordance with some embodiments of the present disclosure.

DETAILED DESCRIPTION

Figure 1:
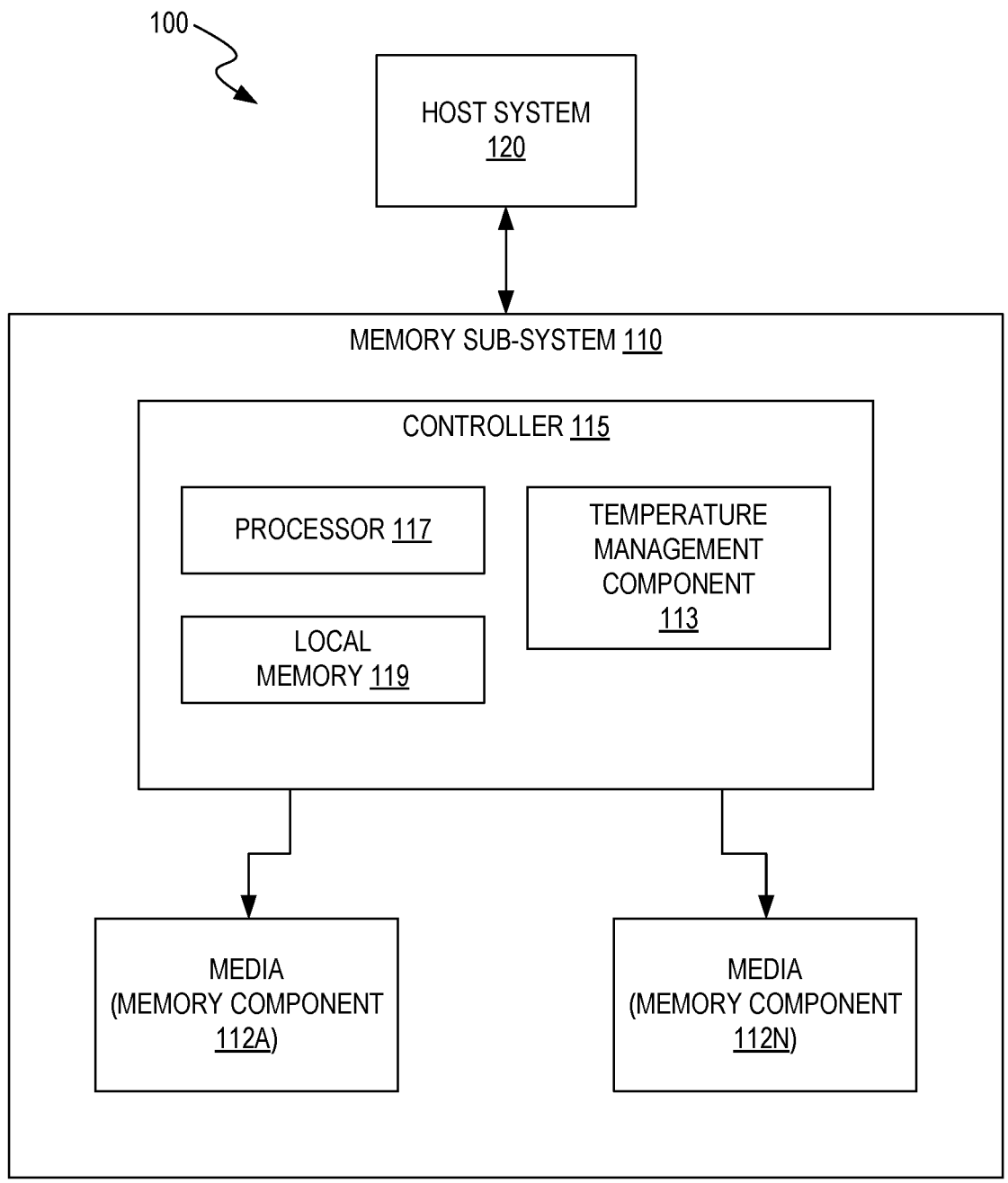
FIG. 1 illustrates an example computing environment that includes a memory sub-system in accordance with some embodiments of the present disclosure.

Aspects of the present disclosure are directed to providing dynamic temperature compensation in a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system using write (also hereinafter referred to as "program") requests and can retrieve data from the memory sub-system using read requests. In some embodiments, the memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory.

Memory components, such as flash based memory, utilize electrical energy, along with corresponding threshold levels or processing voltage levels, to store and access data. The performance or characteristics of the memory components can change due to changes in operating temperature of the memory component, which can occur because of, for example, ambient temperature changes and/or heat generated by the memory component during operation. For example, a change in the operating temperature can cause the threshold voltage distributions (also hereinafter referred to as "program distributions") in the flash based memory to shift, which can affect the voltage levels used at the gates of the memory cells for memory operations, such as, for example, read operations and write operations. Write operations are also hereinafter referred to as "program verify (PV) operations." If the temperature changes are not properly compensated, the shift in the program distributions can cause performance and reliability issues by, for example, increasing the bit error rate (BER) in the memory component.

A conventional memory sub-system can have memory components with calibrated circuits to provide voltage adjustments (also hereinafter referred to as "trims") for temperature compensating the gate voltage levels at the memory cells during memory operations. The calibration procedure in such conventional memory sub-systems can include performing read operations and PV operations at predetermined temperatures (typically two predetermined temperatures) and calculating a linear curve fit over the entire operating temperature range of the memory sub-system and/or the memory component. The linear curve fit can then be used to determine the temperature compensation trims to compensate the gate voltage levels for read operations (read levels) and the gate voltage levels for PV operations (PV levels) based on the measured temperature of the memory sub-system or memory device. However, the conventional temperature compensation in such conventional memory sub-systems can be inadequate for a variety of reasons. For example, the shift in the program distribution may not be linear over some portions of the operating temperature range, e.g., at the edges of the temperature range. Moreover, a linear curve fit may not adequately compensate for cross-temperature effects, e.g., when a memory cell is written at a first temperature and subsequently read at a second, different temperature. Accordingly, even with these initial temperature compensation trims (also referred to herein as "manufacturer temperature compensation trims"), the cross-temperature operations of memory cells in conventional memory sub-systems can still result in read level and PV level offsets.

Read level and PV level offsets are the difference (or error) in the manufacturer temperature compensated gate voltage levels and optimum gate voltage levels for the memory operations. In addition to the non-linear program distribution movements, read level offsets and PV level offsets can occur based on the type of manufacturer temperature compensation. For example, because there can be memory component-to-memory component (e.g., die-to-die) temperature variations in the memory sub-system, read/PV level offsets can occur if the conventional memory sub-system uses population-based trims (e.g., trims based on multiple memory components or based on the entire memory sub-system) rather than a memory component-based trims (e.g., trims based on the characteristics of individual dies). Further, the temperature compensation can be different at a sub-die (intra-die) level. Conventional memory sub-systems may not take into account these intra-die level temperature differences when determining the trim values. For example, conventional memory sub-systems may not take into account differences between word line groups, which are groupings of memory pages corresponding to one or more word lines used to implement processing functions (e.g., performing memory operations) in a memory component (e.g., a die). Moreover, a manufacturer calibration to determine temperature compensation trims is performed once and is not performed again. Thus, the manufacturer calibration trims in conventional memory sub-systems remain static throughout the life of the memory sub-system. Accordingly, a conventional memory device can experience poor performance and reliability due to high BER if deficiencies in the manufacturer temperature compensation of gate voltage levels are not accounted for prior to the memory sub-system being placed in normal operation.

Aspects of the present disclosure address the above and other deficiencies by providing dynamic temperature compensation to the gate voltage levels applied to memory cells of a memory sub-system. As used herein, "dynamic temperature compensation" means temperature compensation of the memory component or components in the memory sub-system using the current temperature of the memory component or components in the memory sub-system based on data gathered during in-service operation. As used herein, "in-service operation" means operation of the memory sub-system after the manufacturer temperature calibration trims have been determined. Thus, operation of the memory sub-system after determination of the manufacturer temperature calibration trims, including operations related to a supplemental temperature calibration (or calibrations), is considered an "in-service operation," whether done at the manufacturer's facility or after shipment from the manufacturer.

In some embodiments, a memory sub-system can include a temperature management component to provide the dynamic temperature compensation to the gate voltage levels. For example, the temperature management component can compensate the read levels and/or PV levels at the memory cells by providing dynamic temperature compensation based on in-service calibration data of the read levels and/or the PV levels. The dynamic temperature compensation can be in addition to (i.e., supplementing) the initial temperature compensation provided by the manufacturer temperature compensation trims.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory components 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs), multi-level cells (MLCs) (e.g., triple level cells (TLCs), or quad-level cells (QLCs)). In some embodiments, a particular memory component can include both an SLC memory portion and a MLC memory portion. Each of the memory cells can store one or more bits of data (e.g., data blocks) used by the host system 120. Although non-volatile memory devices such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The memory system controller 115 (hereinafter referred to as "controller") can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N. Each of the memory components 112A to 112N can include one or more dies.

The memory sub-system 110 includes a temperature management component 113 that can be used to temperature compensate memory operations. In some embodiments, the controller 115 includes at least a portion of the temperature management component 113. For example, the controller 115 can include a processor 117 (processing device) configured to execute instructions stored in local memory 119 for performing the operations described herein. In some embodiments, the temperature management component 113 is part of the host system 110, an application, or an operating system.

The temperature management component 113 can provide, for example, feedforward temperature compensation based on a temperature measurement of a memory sub-system and/or a memory component (e.g., temperature of memory sub-system 110 and/or temperature of a memory component 112A to 112N) when the memory sub-system 110 performs memory operations. The temperature compensation performed by the temperature management component 113 provides further gate voltage level adjustments, which can be in the form of modifications to existing trims and/or in the form of new trims. In some embodiments, the temperature management component 113 collects and/or analyzes in-service data associated with memory operations in memory components 112A to 112N of the memory sub-system 110 to calculate the temperature adjustments. For example, the in-service data can be memory operation calibration data such as, for example, read level calibration data and/or PV target calibration data from calibrations performed at various temperatures (e.g., two or more temperatures) during in-service operation of the memory sub-system 110 and/or the memory component 112A to 112N. In some embodiments, the temperature management component 113 uses in-service data that is collected prior to normal operation (e.g., prior to shipment from the manufacturing facility) when calculating the temperature adjustments.

During operation, the temperature management component 113 can receive temperatures of the memory components 112A to 112N, which can be determined by a temperature sensor of the respective memory component. The analyzed in-service data and the memory component temperatures can then be used to calculate dynamic temperature compensation adjustments, which are in addition to the manufacturer determined temperature compensation trims, for adjusting gate voltage levels (e.g., read levels and/or PV levels) during memory operations. In some embodiments, the dynamic temperature compensation adjustments are stored as trims and/or are used to modify existing trims in registers that are used by the controller 115 in generating the gate voltage levels during memory operations. The dynamic temperature compensation trims can be determined on a per memory component basis using the respective memory component temperatures. For brevity and clarity, embodiments where the dynamic temperature compensation adjustments are in the form of trims (e.g., separately stored adjustments) will be discussed. However, as indicated above, the dynamic temperature compensation adjustments can also be in the form of adjustments to one or more existing trims (e.g., read level trim, PV level trim, manufacturer temperature compensation trim, etc.) and/or the base gate voltage value.

FIG. 3 is a flow diagram illustrating example method 300 for managing dynamic temperature compensation of memory operations. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the temperature management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the processing device (e.g., processor 117) determines a dynamic temperature compensation trim based on in-service data for a memory operation on a memory cell in a memory component (e.g., memory component 112A to 112N) and based on a temperature of the memory component. The memory operation can be a read operation on a memory cell and/or a PV operation on a memory cell. In some embodiments, the in-service data can be the data collected by the read level calibration component 260 during read operations in the memory component 112A to 112N. In some embodiments, the in-service data can be the data collected by the PV target calibration component 265 during PV operations in the memory component 112A to 112N.

Figure 4:
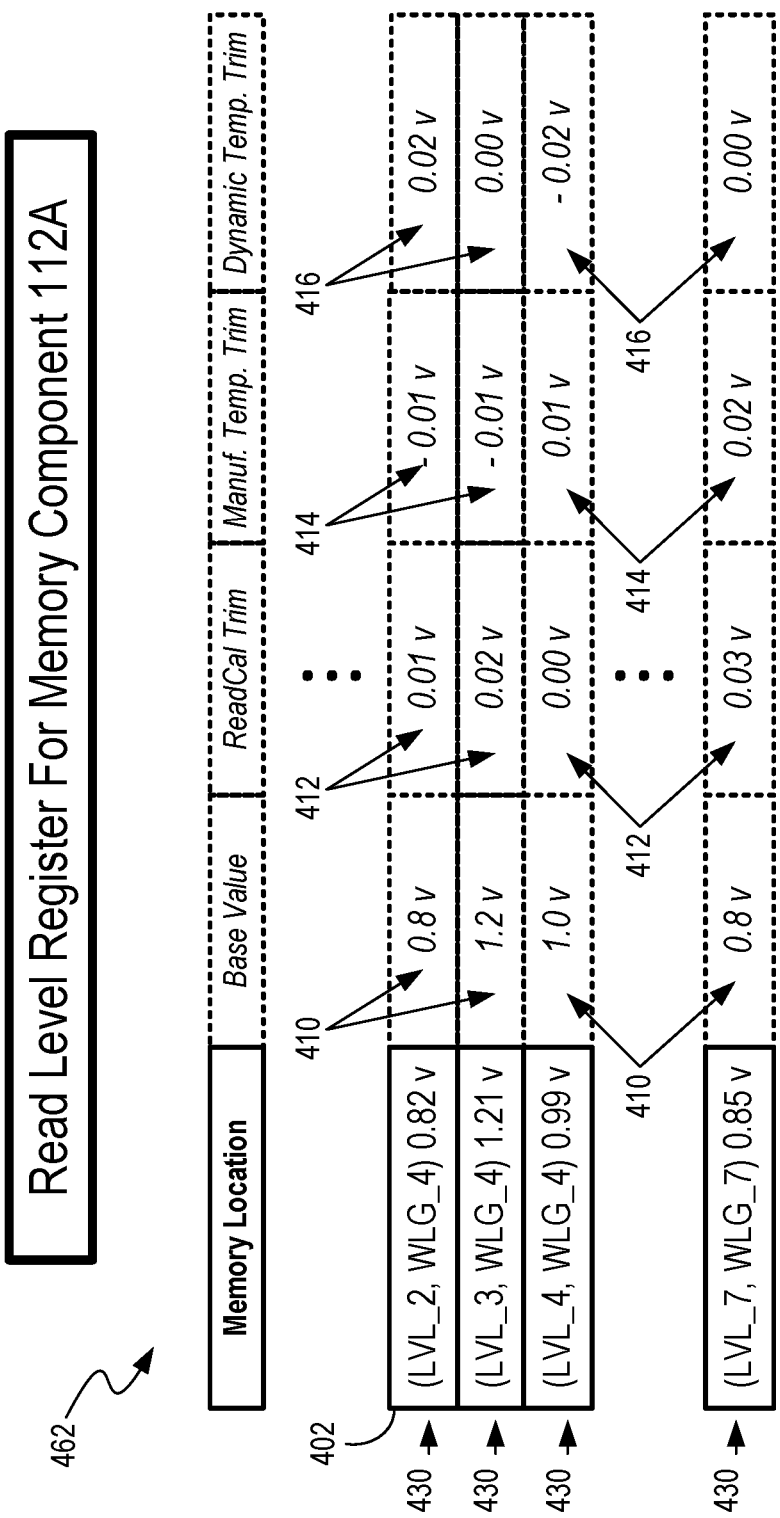
FIG. 4 illustrates a block diagram of a read level register, in accordance with some embodiments of the present disclosure.

At block 320, the processing device (e.g., processor 117) modifies a register corresponding to the memory operation on the memory cell based on the dynamic temperature compensation trim, where the dynamic temperature compensation trim is for use in temperature compensating the memory operation. Based on the type of memory operation, the processing device can modify a read level register used for read operations to include the dynamic temperature compensation trim (see, e.g., FIG. 4 illustrating an example read level register 462 in accordance with an embodiment of the disclosure, which includes dynamic temperature compensation trim 416), or the processing device can modify a PV level register used for PV operations to include the dynamic temperature compensation trim (see, e.g., FIG. 5 illustrating an example PV level register 568, which includes dynamic temperature compensation trim 516). Further details with regards to the method of operation of the memory sub-system 110, including temperature management component 113, are described below.

Figure 2:
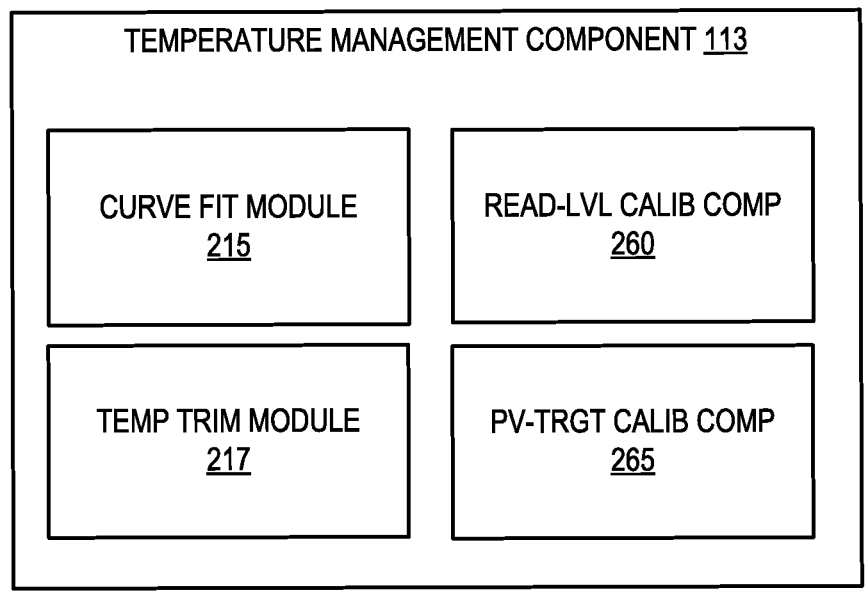
FIG. 2 illustrates an example temperature management component in accordance with some embodiments of the present disclosure.

As discussed above, read levels and PV levels in memory components, such as, for example, NAND devices, can shift as a function of the operating temperature, for the compensation of which conventional manufacturer temperature compensation circuits may be inadequate. To compensate for the inadequacies in the initial manufacturer temperature compensation, the temperature management component 113 determines dynamic temperature compensation trims that further temperature compensate the memory operation in order to, for example, minimize the BER. The dynamic temperature compensation trims can be based on, for example, a read level calibration operation (e.g., performed by read level calibration component 260 of FIG. 2) that provides read level offsets and a PV level calibration operation (e.g., performed by PV target calibration component 265 of FIG. 2) that provides PV level offsets. In some embodiments, the memory system 110 and/or the host system 120 stores the read level offsets and the PV level offsets for subsequent analysis by another operation (e.g., curve fit module 215 discussed below). All or part of the read level storage and/or the PV level storage can be in the controller 115 (e.g., in local memory 119), the host 120, in one or more memory components 112A to 112N, or any combination thereof. In some embodiments, the read level offsets and/or the PV level offsets can be determined on a per memory component basis and stored in appropriate registers created in the memory of each respective memory component.

In accordance with one embodiment of the present disclosure, the dynamic temperature compensation trims are based on in-service read level calibration data (e.g., read level offset data) and/or in-service PV level calibration data (e.g., PV level offset data) collected after determining the manufacturer temperature compensation trim and prior to normal operation of the memory sub-system 110 (e.g., prior to shipment from the manufacturing facility). For example, in response to an in-service read level calibration and/or an in-service PV level calibration being performed (e.g., by the respective components 260 and 265), the component temperature and in-service data corresponding to the read levels and/or the PV levels, the word line group, and/or the program level (e.g., L0 to L7 for a TLC type memory device) are stored in memory. The memory storage can reside in host 120, in memory sub-system 110 (including, controller 115, local memory 119 thereof, in one or more memory components 112A to 112N), or any combination thereof. After a series of in-service read level calibrations and/or in-service PV level calibrations) at various temperatures (e.g., two or more temperatures), the controller 115 (or host 120) can perform one or more curve fits on the collected in-service read level calibration data and/or PV level calibration data that describe how a particular read level and/or PV level changes as a function of temperature. In some embodiments, the curve fits are based on a combination of in-service data and data collected when determining the manufacturer temperature compensation trim. The curve fits can be used to provide coefficients for use in equations to determine the dynamic temperature compensation trims. In this regard, the temperature management component 113 can include a curve fit module (e.g., the curve fit module 215 of FIG. 2) to perform the curve fits on the read level calibration data and/or the PV level calibration data. In some embodiments, a curve fit is performed for each read level and/or PV level dynamic temperature compensation trim. For example, the curve fits are done for each program level of each word line group of each memory component.

In some embodiments, the curve fit module 215 performs a curve fit for a temperature range that includes the full operating temperature rage of the memory sub-system 110, such as, for example −37 deg. C. to 115 deg. C. In other embodiments, one or more curve fits are performed for an operating range (or ranges) that is less than the full operating temperature range of the memory sub-system 110. For example, in some embodiments, where the initial manufacturer temperature compensation is acceptable for a portion of the full operating temperature range, the curve fits can be limited to a temperature range (or ranges) in which the manufacturer temperature compensation deviates from acceptable performance values (e.g., acceptable BER values) by a predetermined amount. As an example, if the operating range is −37 deg. C. to 115 deg. C. and the initial manufacturer temperature compensation is acceptable (e.g., BER values in an acceptable range) between 30 deg. C. to 115 deg. C., the curve fits for the read level calibration data and/or the PV level calibration data can be limited to the operating temperature range between −37 deg. C. to 30 deg. C. In some embodiments, the curve fit module 215 will produce a slope coefficient and an offset coefficient corresponding to a linear curve, as shown in equation 1:

$$\text{Temp Trim} = \text{slope coeff} * T + \text{offset coeff} \quad (1)$$

In equation 1, T can be the temperature of a memory component, a portion thereof, and/or a memory sub-system. One or more sets of coefficients, with each set corresponding to a separate temperature range, can be produced by the curve fit module 215. However, embodiments of the present disclosure are not limited to determining coefficients for linear equations and some embodiments can include determining coefficients for non-linear equations. Any combination of linear and non-linear equations can be used to provide dynamic temperature compensation adjustment to all or part of the operating range of the memory sub-system 110. Curve fit algorithms are known to those skilled in the art and thus, for brevity, will not be further discussed.

In some embodiments, the controller 115 and/or the host system 120 can initiate the curve fit module 215 of temperature management component 113 automatically. For example, after a predetermined time period and/or after a predetermined number of data points have been collected from, for example, the read level calibration component 260 and/or the PV level calibration component 265, the controller 115 can initiate the curve fit module 215 to analyze the collected data. In other embodiments, the curve fit module 215 can be initiated manually (e.g., in response to a user command). In some embodiments, the slope and offset coefficients for each trim type (e.g., read level temperature compensation trim and/or PV level temperature compensation trim) are calculated by the curve fit module 215. The slope and offset coefficients for each trim type can be determined on a per memory component basis, on a word line group basis, on a program level basis (e.g., L0 to L7 for a TLC type memory device), or any combination thereof. In some embodiments, the calculated slope and offset coefficients can be stored in a temperature coefficient register such as, for example, temperature coefficient register 600 as seen in FIG. 6. In some embodiments, the register 600 can include a read slope coefficient 610, a read offset coefficient 615, a PV slope coefficient 620, and a PV offset coefficient 625 that are calculated for each program level of each word line group of each memory component, and the calculated coefficients can be stored in corresponding coefficient records 630. Each coefficient record 630 corresponds to one or more memory cells that belong to the specific program level, word line group, and memory component combination. Thus, multiple memory cells belonging to the same memory component, program level, and word line group can have the same set of slope and offset coefficients. In some embodiments, the coefficients are stored in one or more registers in one or more memory components 112A to 112N, in the memory sub-system 110 (e.g., local memory 112), in a memory in host 120, or in any combination thereof.

Once the curve fit coefficients are set up by the curve fit module 215, the temperature trim module 217 of the temperature management component 113 (see FIG. 2) can use the curve fit coefficients to calculate the dynamic temperature compensation trims based on the curve fit coefficients and the temperature of the memory component (e.g., one or more memory components 112A to 112N) during memory operations (e.g., read and/or PV operations). The dynamic temperature compensation trims can supplement the initial manufacturer temperature compensation trims to adjust the gate voltage levels used on the memory cells during memory operations. The dynamic temperature compensation trims can be stored in registers corresponding to the appropriate memory operation, such as, for example, read level registers and/or PV level registers. In some embodiments, which are discussed below, the read level registers and/or the PV level registers store a value that incorporates the dynamic temperature compensation trim or adjustment. During a memory operation such as, for example, a read operation and/or a PV operation, the controller 115 determines the correct gate voltage level to use on the memory cell based on information stored in the appropriate register. For example, the controller 115 uses the information stored in the read level register to calculate the read level when performing a read operation on the memory cell or the information stored in the PV level register to calculate the PV level when performing write operation on the memory cell. The read level register and the PV level register can also include or incorporate other information such as the respective base gate voltage level and any trims (e.g., temperature trims, calibration trims, etc.) to adjust the base gate voltage level. In some embodiments, each value stored in read level register and/or the PV level register can be correlated to a memory component, a word line group, a program level (e.g., L0 to L7 for a TLC type memory device), or any combination thereof.

FIG. 4 illustrates an embodiment of a read level register. As seen in FIG. 4, read level register 462 can have records 430 that store values corresponding to the read levels to be used in reading memory cells of memory components 112A to 112N. In some embodiments, each record 430 can correspond to a specific word line group and program level of a memory component 112A to 112N. Each record 430 can store a base voltage value 410 that represents the gate voltage level to use (prior to any adjustments) in reading a memory cell. However, the base read level voltage will typically require trim adjustments for the reasons discussed above. Accordingly, in some embodiments, the record 430 stores a value incorporating a base voltage value 410 and one or more trim values that are used to adjust the base voltage value 410 before the adjusted voltage is applied to the gate of the memory cell. In the illustrated embodiment of FIG. 4, the base value and trim values are italicized and shown separately in dotted boxes for description purposes. However, in the illustrated embodiment, the memory location for each record 430 stores one value that is the sum of the base voltage value and trim values and is representative of the final gate voltage value. In some embodiments, the value in record 430 incorporates a read calibration trim 412 that can represent the adjustment to the gate voltage by the read level calibration component 260 to, e.g., minimize the BER. The value in record 430 can also incorporate an initial manufacturer temperature compensation trim 414, which represents the manufacturer calibrated temperature compensation adjustment to the gate voltage. The value in record 430 can further incorporate a dynamic temperature compensation trim 416 that provides additional temperature compensation to the memory cell gate voltage based on a measured temperature and the in-service read level calibration data. The measured temperature can be, for example, a memory component temperature from a respective temperature sensor, a representative memory component temperature for multiple memory components 112A to 112N, a temperature of one or more memory components 112A to 112N, a temperature of the controller 115, a temperature of the memory sub-system 110, or any combination thereof. The dynamic temperature compensation trim 416 can be calculated by the temperature management component 113 as discussed herein.

When the controller 115 performs a read operation on a memory cell, the controller 115 reads the appropriate record 430 in the read level register 462 corresponding to the memory component, program level, and word line group of the pertinent memory cell. The value in record 430 corresponds to the base voltage value 410 and any trim adjustments to the base voltage value 410 such as, for example, trims 412, 414, and 416. The appropriate read level for the memory cell is the sum of the base voltage value 410 and the trim adjustments. For example, if the controller 115 needs to perform a read operation on a memory cell that is program level 2 in word line 4 in memory component 112A, the controller 115 reads the value in register record 402. In value in record 402 corresponds to the base value 410, which is 0.8 volts, and any trim adjustments to the base value 410. Thus, in the absence of any trim adjustments, the value in record 402 is 0.8 volts, which is used as the read level when performing a read operation on the pertinent memory cell. However, the base voltage value 410 is typically subject to trim adjustments due to factors such as, for example, BER, temperature, and/or other factors that can affect reading of the memory cell. In the illustrated embodiment, the base value 410 is subject to a read calibration trim 412 that is +10 mV, a manufacturer determined temperature compensation trim 414 that is −10 mV, and a dynamic temperature compensation trim calculated by the temperature trim module 217 that is 20 mV. Prior to reading a memory cell associated with register record 402, the controller 115 (or some other controller) will sum the base voltage value 410 and the trim values 412, 414 and 416 (plus any other trims if used) to calculate the read level to use for the read operation (e.g., Read Level=BaseValue+ReadCalTrim+ManufacturerTempTrim+DynamicTempTrim). The summed value is then stored in record 402. Thus, the value stored in record 402 corresponds to a read level of 0.82 volts (0.8+0.01−0.01+0.02=0.82 volts). Each record 430 corresponds to one or more memory cells that belong to the specific program level, word line group, and memory component combination. Thus, while the description refers to a single memory cell, multiple memory cells belonging to the same memory component, program level, and word line group can have the same read level value.

FIG. 5 illustrates an embodiment of a PV level register. As seen in FIG. 5, PV level register 568 can have records 530 that store values corresponding to the PV levels to be used in programing memory cells of memory components 112A to 112N. In some embodiments, each record 530 can correspond to a specific word line group and program level of a memory device 112A to 112N. Each record 530 can store a base voltage value 510 that represents the gate voltage level to use (prior to any adjustments) in reading a memory cell. However, the base PV level voltage will typically require trim adjustments for the reasons discussed above. In some embodiments, the record 530 stores a value incorporating a base voltage value 510 and one or more trim values that are used to adjust the base voltage value 510 before the adjusted voltage is applied to the gate of the memory cell. In the illustrated embodiment of FIG. 5, the base value and trim values are italicized and shown separately in dotted boxes for description purposes. However, in the illustrated embodiment, the memory location for each record 530 stores one value that is the sum of the base voltage value and trim values. In some embodiments, the value in record 530 incorporates a PV calibration trim 512 that can represent the adjustment to the gate voltage by the PV target calibration component 265 to, e.g., minimize the BER. The value in record 530 can also incorporate an initial manufacturer temperature compensation trim 514, which represents the manufacturer calibrated temperature compensation adjustment to the gate voltage. The value in record 530 can further incorporate a dynamic temperature compensation trim 516 that provides additional temperature compensation to the memory cell gate voltage based on a measured temperature and the in-service PV level calibration data. The measured temperature can be, for example, a memory component temperature from a respective temperature sensor, a representative memory component temperature for memory components 112A to 112N, a temperature of one or more memory components 112A to 112N, a temperature of the controller 115, a temperature of the memory sub-system 110, or any combination thereof. The dynamic temperature compensation trim 516 can be calculated by the temperature management component 113 as discussed herein.

Similar to the read operation, when the controller 115 performs a PV operation to a memory cell, the controller 115 reads the appropriate record 440 in the PV level register 568 corresponding to the memory component, program level, and word line group of the pertinent memory cell. The value in record 530 corresponds to the base voltage value 510 and any trim adjustments to the base voltage value 510 such as, for example, trims 512, 514, and 516. The appropriate PV level for the memory cell is the sum of the base voltage value 510 and the trim adjustments. For example, if the controller 115 needs to perform a PV operation to a memory cell that is program level 2 in word line 4 in memory component 112A, the controller 115 reads the value in register record 502. In value in record 502 corresponds to the base value 510, which is 0.9 volts, and any trim adjustments to the base value 510. Thus, in the absence of any trim adjustments, the value in record 502 is 0.9 volts, which is used as the PV level when perform a PV operation on the pertinent memory cell. However, the base voltage value 510 is typically subject to trim adjustments due to factors such as, for example, BER, temperature, and/or other factors that can affect writing to the memory cell. In the illustrated embodiment, the base value 510 is subject to a PV level calibration trim 512 that is +20 mV, a manufacturer determined temperature compensation trim 514 is −20 mV, and a dynamic temperature compensation trim calculated by the temperature trim module 217 that is 30 mV. Prior to reading a memory cell associated with register record 502, the controller 115 (or some other controller) will sum the base voltage value 510 and the trim values 512, 514 and 516 (plus any other trims if used) to calculate the PV level to use for the PV operation (e.g., PV Level=BaseValue+PVCalTrim+ManufacturerTempTrim+DynamicTempTrim). The summed value is then stored in record 502. Thus, with the value stored in record 502 corresponds to a PV level of 0.93 volts (0.9+0.02−0.02+0.03=0.93 volts). Each record 530 corresponds to one or more memory cells that belong to the specific program level, word line group, and memory component combination. Thus, while the description refers to a single memory cell, multiple memory cells belonging to the same memory component, program level, and word line group can have the same PV level value.

Prior to a read and/or the PV operation, the controller 115 can initiate the temperature management component 113, including the temperature trim module 217, to determine the dynamic temperature compensation trim(s) 416, 516 for the read level and/or the PV level based on the curve fit coefficients calculated by the curve fit module 215. The temperature management component 113 can then use the dynamic temperature compensation trim(s) 416, 516 to adjust the values in the read level register 462 and/or the PV level register 568, as discussed above. In some embodiments, the curve fit module 215 is initiated only once prior to normal operation of the memory sub-system 110 and the calculated set of coefficients are used during the life of the memory sub-system 110. The temperature trim module 217 can update the temperature compensation trims 416, 516 on a periodic basis, whenever the temperature of a component in the memory sub-system 110 (e.g., a memory component) changes, and/or on demand (such as, for example, when the controller 115 is requested to perform a memory operation). When initiated, as discussed above, the temperature trim module 217 will read the appropriate slope and offset coefficients from, e.g., the coefficient register 600 and calculate a dynamic temperature compensation trim 416, 516 that supplements the manufacturer temperature compensation trim 414, 514. In some embodiments, to calculate the dynamic temperature compensation trims 414, 514, the temperature trim module 217 can read the appropriate memory component temperature from the respective temperature sensor. In the illustrated embodiment, the temperature of memory component 112A is read from its temperature sensor. The temperature trim module 217 then calculates the temperature compensation trim 416, 516 by using, for example, Equation 1. Once calculated, the temperature trim module 217 can use the calculated temperature compensation trim to adjust the value in the appropriate record 430 of the read level register 462 or record 530 of the PV level register 568.

In the illustrated embodiments in FIGS. 4 and 5, the calculated temperature compensation trims 416, 516 are shown in the respective records 430, 530 as separate values. However, in some embodiments, the temperature trim module 217 can modify any one or more of the other values in record 430, 530 instead. For example, for the read level register, the base value 410, the read calibration trim 412, and/or the manufacturer temperature compensation trim 414 can be modified to incorporate the calculated temperature compensation trim 416 prior to the value in record 430 being adjusted. Similarly, for the PV level register, the base value 510, the PV calibration trim 512, and/or the manufacturer temperature compensation trim 514 can be modified to incorporate the calculated temperature compensation trim 516 prior to the value in record 530 being adjusted. In some embodiments, the temperature trim module 217 can directly modify the final read level and/or the PV level without using registers 462, 568.

In some embodiments, as discussed above, the temperature trim module 217 can update the dynamic temperature compensation trims 416, 516 periodically, each time the temperature T of a memory component changes, and/or on demand when a memory operation takes place. However, depending on the type of memory (MLC, TLC, QLC, etc.), updating the dynamic temperature compensation trims 416, 516 can get resource intensive and degrade the performance of the memory sub-system 110. For example, in some scenarios, the temperature trim module 217 can continuously update register records corresponding to memory cells, which can cause performance issues. Even when the temperature trim module 217 is not continuously updating the calculated temperature compensation trims 416, 516, there can still be performance issues due to the large number of temperature compensation trims 416, 516 that need to be updated. For example, in a memory component configured as, for example, a TLC component, there can be 64 temperature compensation trims per memory component that will need to be populated based on, for example, the number of word line groups and the program levels. In a memory sub-system that has 10 memory components, the number of temperature compensation trims that need to be updated will be 640 for the read level trims and 640 for the PV level trims. The processor resource situation is even worse for a QLC type memory component, which requires that 200+ read level trims and 200+ PV level trims be updated per memory component. To minimize the need for updates, in some embodiments, the dynamic temperature compensation trims 416, 516 for each memory component are updated only if the respective memory component temperature changes by a predetermined amount. The predetermined amount can be, for example, in a range of 5-10 deg. C. from the last time the dynamic temperature compensation trims 416, 516 for that memory component were updated. Thus, while the memory component temperatures can be monitored continuously, the temperature compensation trims for a given memory component are only updated when the respective memory component temperature changes from the temperature of the previous update by the predetermined amount.

In some embodiments, to further conserve processing resources in the memory sub-system 110, the temperature of one or more reference memory component (but less than all the memory components) can be monitored and the dynamic temperature compensation trims 416, 516 for all the memory components 112A to 112N can be updated when the reference memory component (or some combination of reference memory components) changes from the temperature of the previous update by the predetermined amount. For example, the temperature sensor in memory device 112A can be monitored on a continuous basis. When the temperature of memory component 112A changes from the temperature of the previous update by a predetermined amount (e.g., a predetermined amount in a range of 5 to 10 deg. C.), the temperatures of all memory components 112A to 112N can be read from their respective temperature sensors and the dynamic temperature compensation trims 416, 516 for each of the memory components 112A to 112N can be updated based on the respective memory component temperatures.

In some embodiments, instead of calculating a unique dynamic temperature compensation trim for each measured memory component temperature T using Equation 1, one or more predetermined dynamic temperature compensation trims with each trim corresponding to a range of memory component temperatures can be used. That is, based on the curve fit data determined by the curve fit module 215, one or more predetermined dynamic temperature compensation trims can be calculated based on a representative temperature within the respective temperature range. Each temperature range can be a subrange of the operating range of the memory sub-system 110. For example, for a subrange of –10 deg. C. to 15 deg. C., the temperature trim module 217 can read the appropriate slope and offset coefficients determined by the curve fit module 215 and calculate a representative temperature compensation trim based on a representative temperature for that subrange, such as, for example, 3 deg. C. (or some other representative temperature within the subrange of –10 deg. C. to 15 deg. C.). Once calculated, the predetermined dynamic temperature compensation trim or trims can be stored in an appropriate data structure. For example, the predetermined dynamic temperature compensation trim or trims can be stored in a look-up-table (LUT), as discussed below. By using predetermined dynamic temperature compensation trims, the memory sub-system 110 conserves processing resources by merely looking up values in a LUT (or a similar data structure) based on the memory component temperature instead of calculating the dynamic temperature compensation trims using equation 1.

In some embodiments, the temperature management component 113 and/or another program creates a LUT (or a similar data structure) to store the one or more predetermined dynamic temperature compensation trims. The LUT can be specific to each memory component, specific to each type of memory operation (e.g., read operation, PV operation), specific to each program level (e.g., L0 to L7 for a TLC type memory device), or any combination thereof. The temperature range or ranges can collectively cover part or all of the operating temperature range of the memory system 110. For example, if the operating range of the memory device is –37 deg. C. to 115 deg. C., the LUT can split the operating range into one or more subranges that cover at least a portion of the operating range. As seen in Table 1, the operating range of –37 deg. C. to 115 deg. C. is split into seven subranges.

TABLE 1

| Temp. Subrange No. | Upper Limit (Deg. C.) | Lower Limit (Deg. C.) | Dynamic Temp. Trim (Memory Comp 112A, WLG 4, L2) |
|---|---|---|---|
| 1 | 115 | 20 | 0 mV |
| 2 | 30 | 5 | −10 mV |
| 3 | 15 | −10 | −10 mV |
| 4 | 0 | −15 | 0 mV |
| 5 | −5 | −20 | 10 mV |
| 6 | −15 | −30 | 10 mV |
| 7 | −25 | −37 | 20 mV |

The first column of Table 1 stores the index to the subrange and the second and third columns store the upper and lower temperature limits for each temperature subrange. The last column stores the predetermined dynamic temperature compensation trim for each of the temperature subranges. Although seven subranges are show in Table 1, the number of subranges can be higher or lower than seven. The data in the subranges can be based on linear curve fits, non-linear curve fits, or a combination of linear curve fits and non-linear curve fits. For example, subranges 1-3 can be based on linear curve fits, while subranges 4-7 can be based on non-linear curve fits (or any other combination thereof).

The predetermined dynamic temperature compensation trims can be calculated using a representative temperature within the respective subrange and Equation 1, as discussed above. In some embodiments, the representative temperature for a given temperature subrange corresponds to a temperature in which the calculated trim for that temperature (i.e., the representative temperature) is within a predetermined percentage of the trims calculated using the other temperatures within that subrange. In some embodiments, the representative temperature provides trim that at a midpoint of the trims calculated using the other temperatures within that subrange. In some embodiments, the representative temperature can be determined using performance factors such as, for example, BER.

Based on the measured memory component temperature, the temperature trim module 217 can set a pointer to the appropriate temperature subrange. For example, for a memory component temperature of 2 deg. C., the temperature trim module 217 can set the pointer to subrange 3. When set, the temperature trim module 217 will read the predetermined dynamic temperature compensation trim, which is −10 mV in this case, and update the appropriate register record, e.g., records 430 in the read level register 462 and/or register 530 in the PV level register 568 with the predetermined dynamic temperature compensation trim. During memory operations, the gate voltages for the memory operation are adjusted based on the predetermined dynamic temperature compensation trim, as discussed above. If the memory component temperature stays within the selected range, the temperature trim module 217 performs no further action with respect to selecting subranges, reading the predetermined dynamic temperature compensation trim in the LUT (or other data structure), and/or using the predetermined dynamic temperature compensation trim to adjust the value in the read level register 462 and/or the PV level register 568. When compared to embodiments where the read level register 462 and PV level register 568 are continuously updated based on changes in the memory component temperature, the processor resources in a memory sub-system 110 using the LUT (or similar data structure) approach are conserved. If the memory component temperature changes, for example from 2 deg. C. to −11 deg. C., the temperature trim module 217 will select subrange 4, read the predetermined temperature compensation trim for subrange 4, which is 0 mV in this case, and update the read level register 462 and/or the PV level register 568. To prevent the temperature trim module 217 from continuously updating the register fields if the memory component temperature is fluctuating, some embodiments of the present disclosure can include a hysteresis between the subranges. For example, in Table 1, although the range select from subrange 3 to subrange 4 happens when the memory component goes below −11 C, the range selection back to subrange 3 will happen when the memory component temperature goes above 0 deg. C. The hysteresis deadbands between the temperature subranges are not limited to those given above in Table 1 and can be in a range from 1 deg. C. to 15 deg. C.

In some embodiments, the number of temperature subranges and the upper and lower values for each subrange are independently based on the in-service data (e.g., read level calibration data and/or the PV target calibration data) and can be on a per memory component basis, on a word line group basis, on a program level basis (e.g., L0 to L7 for a TLC type memory device), or any combination thereof. That is, the number of temperature subranges and the upper and lower limits of each subrange need not be the same across the memory components, across word line groups within a memory component, and/or across program levels within a memory component. In other embodiments, a common set of temperature subranges is used across memory components, across word line groups within a memory component, and/or across program levels within a memory component. In some embodiments, all the memory component temperatures are monitored independently using the respective temperature sensors and the respective LUTs are updated as discussed above. However, in some embodiments, a representative temperature is monitored instead of all the memory component temperatures to save on processor resources. The representative temperature can be based on a reference memory component temperature, the temperature of the controller 115 and/or some other temperature in the memory sub-system 110. In some embodiments, when a representative temperature is monitored, a common set of temperature ranges are used across the memory components. In this case, when the representative temperature crosses a boundary between temperature ranges, all the memory component temperature sensors are read and the respective tables in each memory component are updated accordingly.

In the above embodiments, the dynamic temperature compensation trims are calculated from in-service data (e.g., the read calibration data and/or PV target calibration data) to account for any inaccuracies in the initial manufacturer temperature compensation trims. However, in some embodiments, the dynamic temperature compensation trims can still be deficient with respect to eliminating or significantly reducing inaccuracies in the manufacturer temperature compensation trims. For example, in some cases, the dynamic temperature compensation trims calculated using edge temperatures (e.g., temperatures at either end of the operating range) may not properly temperature compensate the memory operations (e.g., read and/or PV operations). These inaccuracies can occur because the curve fits and the resulting coefficients are designed to provide gradual temperature trim adjustments between temperature ranges, and thus are not designed to take into account sudden changes in the in-service data (e.g., read calibration data and/or the PV target calibration data). In such cases, the calculated temperature compensation trim for the relevant temperature subrange can be replaced by and/or modified by an additional trim adjustment that corrects or minimizes the inaccuracies in the curve fit coefficients. For example, subrange 7 in Table 1 can represent an edge temperature range where the calculated predetermined supplemental trim of 20 mV does not adequately correct for the deficiencies in the manufacturer temperature compensation trim. In such a case, in addition to or instead of the dynamic temperature compensation trim calculated by temperature trim module 217 for subrange 7, the temperature trim module 217 (or another program) calculates an additional adjustment, for example, based on a difference between the values produced by the curve fit coefficients and the raw in-service data (e.g., read calibration data and/or PV target calibration data, as appropriate). The additional adjustment can be a trim that is added to the read level register 462 and/or the PV level register 568 and/or used to modify an existing value in record 430 or 530, as discussed above.

In the above embodiments, the manufacturer temperature compensation and the temperature management component 113 are feedforward circuits with the temperature management component 113 being based on the current memory component temperature. That is, there is no feedback to correct for any discrepancies in the temperature compensation. However, as the memory system 110 performs program erase cycles (PECs), the required temperature compensation can change in memory devices 112A to 112N based on the number of PECs. In some embodiments of the disclosure, the temperature managing component 113 can be initiated to update the dynamic temperature compensation trims based on a predetermined number of PECs.

Figure 7:
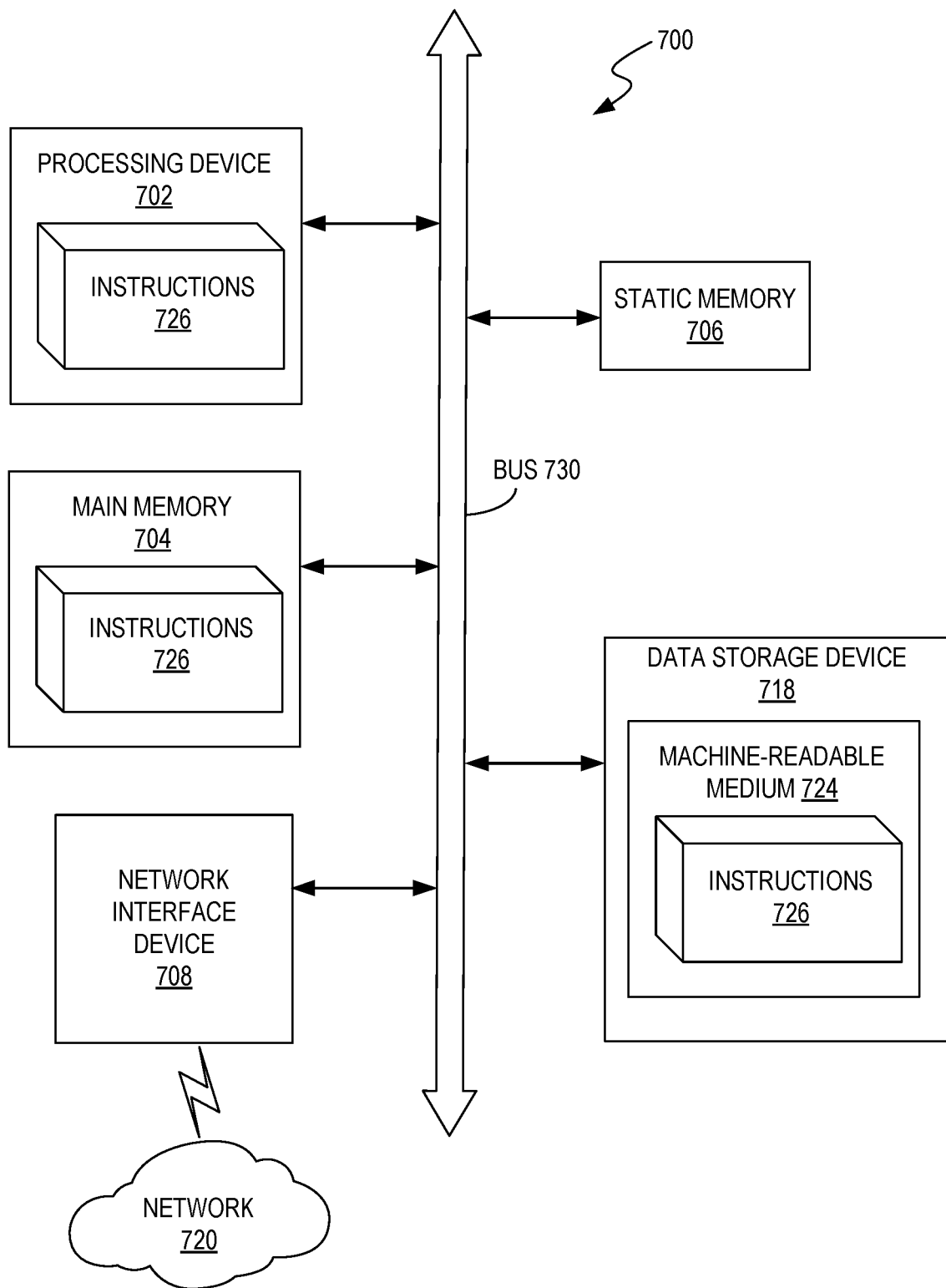
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

Processing device 702 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage device 718 can include a machine-readable storage medium 724 (also known as a computer-readable medium) on which is stored one or more sets of instructions or software 726 embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one implementation, the instructions 726 include instructions to implement functionality corresponding to a temperature component (e.g., temperature management component 113 of FIG. 1). While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

We claim:

1. A system, comprising:
    a memory component having a register corresponding to a memory operation on a memory cell of the memory component; and
    a processing device, operatively coupled with the memory component, to:
        determine a dynamic temperature compensation trim for use in temperature compensating the memory operation, the determining of the dynamic temperature compensation trim being based on a temperature of the memory component and based on in-service data for the memory operation on the memory cell, and
        modify the register based on the dynamic temperature compensation trim,
        wherein the in-service data includes at least one of read level calibration data or program verify level calibration data, where the program verify level calibration data checks a write operation voltage level.

2. The system of claim 1, wherein the processing device adjusts a gate voltage level applied to the memory cell based on the dynamic temperature compensation trim.

3. The system of claim 1, wherein the register is modified based on the temperature of the memory component in response to the memory operation being performed.

4. The system of claim 1, wherein the register is modified based on a predetermined change in the temperature of the memory component subsequent to a prior modification of the register.

5. The system of claim 1, wherein the memory operation is one of a read operation or a program verify operation performed on the memory cell,
    wherein the memory cell belongs to a word line group of the memory component, and
    wherein the dynamic temperature compensation trim corresponds to memory cells of the word line group.

6. The system of claim 1, wherein the dynamic temperature compensation trim is based on a temperature subrange selected from a plurality of temperature subranges,
    wherein the selection of the temperature subrange is based on a temperature of the memory component, and
    wherein the temperature subrange covers at least a portion of an operating temperature range of the memory component.

7. The system of claim 6, wherein the dynamic temperature compensation trim for each temperature subrange is a predetermined value corresponding to a representative temperature within the respective temperature subrange.

8. A method, comprising:
    determining a dynamic temperature compensation trim for use in temperature compensating a memory operation on a memory cell of a memory component, the determining of the dynamic temperature compensation trim based on a temperature of the memory component and based on in-service data for the memory operation on the memory cell; and
    modifying a register corresponding to the memory operation on the memory cell based on the dynamic temperature compensation trim,
    wherein the in-service data includes at least one of read level calibration data or program verify level calibration data, where the program verify level calibration data checks a write operation voltage level.

9. The method of claim 8, further comprising:
    adjusting a gate voltage level applied to the memory cell based on the dynamic temperature compensation trim.

10. The method of claim 8, wherein the register is modified based on the temperature of the memory component each time the memory operation is performed.

11. The method of claim 8, wherein the register is modified based on a predetermined change in the temperature of the memory component subsequent to a prior modification of the register.

12. The method of claim 8, wherein the memory operation is one of a read operation or a program verify operation performed on the memory cell, wherein the memory cell belongs to a word line group of the memory component, and wherein the dynamic temperature compensation trim corresponds to memory cells of the word line group.

13. The method of claim 8, wherein the dynamic temperature compensation trim is based on a temperature subrange selected from a plurality of temperature subranges,
   wherein the selection of the temperature subrange is based on a temperature of the memory component, and
   wherein the temperature subrange covers at least a portion of an operating temperature range of the memory component.

14. The method of claim 13, wherein the dynamic temperature compensation trim for each temperature subrange is a predetermined value corresponding to a representative temperature within the respective temperature subrange.

15. A non-transitory computer-readable storage medium comprising instructions that, when executed by a processing device, cause the processing device to:
   determine a dynamic temperature compensation trim for use in temperature compensating a memory operation on a memory cell of a memory component, the determining of the dynamic temperature compensation trim based on a temperature of the memory component and based on in-service data for the memory operation on the memory cell; and
   modify a register corresponding to the memory operation on the memory cell based on the dynamic temperature compensation trim,
   wherein the in-service data includes at least one of read level calibration data or program verify level calibration data, where the program verify level calibration data checks a write operation voltage level.

16. The non-transitory computer-readable storage medium of claim 15, wherein the instructions further cause the processing device to:
   adjust a gate voltage level applied to the memory cell based on the dynamic temperature compensation trim.

17. The non-transitory computer-readable storage medium of claim 15, wherein the register is modified based on the temperature of the memory component each time the memory operation is performed.

18. The non-transitory computer-readable storage medium of claim 15, wherein the register is modified based on a predetermined change in the temperature of the memory component subsequent to a prior modification of the register.

19. The non-transitory computer-readable storage medium of claim 15, wherein the memory operation is one of a read operation or a program verify operation performed on the memory cell,
   wherein the memory cell belongs to a word line group of the memory component, and
   wherein the dynamic temperature compensation trim corresponds to memory cells of the word line group.

20. The non-transitory computer-readable storage medium of claim 15, wherein the dynamic temperature compensation trim is based on a temperature subrange selected from a plurality of temperature subranges,
   wherein the selection of the temperature subrange is based on a temperature of the memory component, and
   wherein the temperature subrange covers at least a portion of an operating temperature range of the memory component.

* * * * *